(12) United States Patent
Takahashi et al.

(10) Patent No.: US 11,846,736 B2
(45) Date of Patent: Dec. 19, 2023

(54) SCINTILLATOR FOR CHARGED PARTICLE BEAM APPARATUS AND CHARGED PARTICLE BEAM APPARATUS

(71) Applicant: Hitachi High-Tech Corporation, Tokyo (JP)

(72) Inventors: Eri Takahashi, Tokyo (JP); Shin Imamura, Tokyo (JP); Makoto Suzuki, Tokyo (JP); Shunsuke Mizutani, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 189 days.

(21) Appl. No.: 17/617,277

(22) PCT Filed: Jul. 10, 2019

(86) PCT No.: PCT/JP2019/027312
§ 371 (c)(1),
(2) Date: Dec. 7, 2021

(87) PCT Pub. No.: WO2021/005743
PCT Pub. Date: Jan. 14, 2021

(65) Prior Publication Data
US 2022/0244412 A1  Aug. 4, 2022

(51) Int. Cl.
*G01T 1/202* (2006.01)
*H01J 37/244* (2006.01)
(Continued)

(52) U.S. Cl.
CPC .......... *G01T 1/2023* (2013.01); *H01J 37/244* (2013.01); *H01J 49/025* (2013.01);
(Continued)

(58) Field of Classification Search
CPC ........ G01T 1/2023; G01T 1/20; H01J 37/244; H01J 49/025; H01J 37/28; H01J 49/26;
(Continued)

(56) References Cited

U.S. PATENT DOCUMENTS

2006/0219998 A1* 10/2006 Sato .................. H01L 33/32
257/12
2017/0098746 A1* 4/2017 Bergmann .............. H01L 33/22
(Continued)

FOREIGN PATENT DOCUMENTS

JP     2000-319653 A    11/2000
JP     2006-310819 A    11/2006
(Continued)

OTHER PUBLICATIONS

International Search Report of PCT/JP2019/027312 dated Sep. 24, 2019.
(Continued)

*Primary Examiner* — David A Vanore
(74) *Attorney, Agent, or Firm* — MATTINGLY & MALUR, PC

(57) ABSTRACT

The purpose of the present invention is to provide a scintillator for a charged particle beam device and a charged particle beam device which achieve both an increase in emission intensity and a reduction in afterglow intensity. This scintillator for a charged particle beam device is characterized by comprising a substrate (13), a buffer layer (14) formed on a surface of the substrate (13), a stack (12) of a light emitting layer (15) and a barrier layer (16) formed on a surface of the buffer layer (14), and a conductive layer (17) formed on a surface of the stack (12) and by being configured such that the light emitting layer (15) contains InGaN, the barrier layer (16) contains GaN, and the ratio b/a (Continued)

of the thickness b of the barrier layer (16) to the thickness a of the light emitting layer (15) is 11 to 25.

15 Claims, 3 Drawing Sheets

(51) Int. Cl.
  *H01J 49/02* (2006.01)
  *H01J 37/28* (2006.01)
  *H01J 49/26* (2006.01)
(52) U.S. Cl.
  CPC ............... *H01J 37/28* (2013.01); *H01J 49/26* (2013.01); *H01J 2237/2443* (2013.01); *H01J 2237/2448* (2013.01); *H01J 2237/2803* (2013.01)
(58) Field of Classification Search
  CPC ....... H01J 2237/2443; H01J 2237/2448; H01J 2237/2803; H01J 1/63; H01J 49/06; C09K 11/62
  See application file for complete search history.

(56) References Cited

U.S. PATENT DOCUMENTS

| | | | |
|---|---|---|---|
| 2019/0027351 A1* | 1/2019 | Imamura | ................... G01T 1/20 |
| 2022/0244412 A1* | 8/2022 | Takahashi | ............. G01T 1/2023 |
| 2022/0413169 A1* | 12/2022 | Imamura | ................... G01T 1/24 |

FOREIGN PATENT DOCUMENTS

| | | | | |
|---|---|---|---|---|
| JP | 2017-135039 A | | 8/2017 | |
| JP | 2017135039 A | * | 8/2017 | ............... G01T 1/20 |
| TW | 200717861 | | 5/2007 | |

OTHER PUBLICATIONS

Taiwanese Office Action received in corresponding Taiwanese Application No. 109118920 dated Apr. 8, 2021.

* cited by examiner

SCINTILLATOR FOR CHARGED PARTICLE BEAM APPARATUS AND CHARGED PARTICLE BEAM APPARATUS

TECHNICAL FIELD

The present invention relates to a scintillator for a charged particle beam apparatus and a charged particle beam apparatus.

BACKGROUND ART

A detector for detecting charged particles obtained by irradiating a sample with a charged particle beam such as an electron beam is provided in a charged particle beam apparatus that detects the charged particles. For example, when electrons emitted from a sample are detected by scanning the sample with an electron beam, the electrons are guided to a scintillator of the detector by applying a positive voltage of about 8 to 10 kV, which is called a post voltage, to an electron detector. Alternatively, a method in which a detector is provided on the trajectory of electrons, and electrons are caused to be incident on the scintillator without applying the post voltage is also conceivable. Light generated by the scintillator due to collision of electrons is guided to a light guide, converted into an electric signal by a photodetector such as a photoelectric tube, and becomes an image signal or a waveform signal.

PTL 1 discloses a charged particle detector and a charged particle beam apparatus including a luminescence unit having a quantum well structure in which layers containing GaInN and GaN are stacked. In addition, PTL 2 discloses a GaN-based compound semiconductor laminate having a quantum well structure including a well layer having a non-uniform thickness and a well layer having a uniform thickness.

CITATION LIST

Patent Literature

PTL 1: JP 2017-135039 A
PTL 2: JP 2006-310819 A

SUMMARY OF INVENTION

Technical Problem

In a scintillator having a quantum well structure, layers containing GaN, InGaN, and the like are alternately stacked, but, since lattice constants are different, distortion occurs in the structure, and there is a possibility that luminescence intensity decreases or afterglow intensity increases. If afterglow is generated, the afterglow hinders main detection of luminescence, and attenuation takes time. Thus, it becomes difficult to detect the luminescence at a high speed. The afterglow is generated due to various factors, and it is conceivable that yellow luminescence that is luminescence around a wavelength of 550 nm is a main factor.

PTLs 1 and 2 are characterized by an increase in response speed and an increase in luminescence intensity due to a change in quantum well structure and composition. However, none of PTLs 1 and 2 takes into consideration the decrease in afterglow intensity when the quantum well structures are stacked.

In view of the above circumstances, an object of the present invention is to provide a scintillator for a charged particle beam apparatus, which achieves both an increase in luminescence intensity and a decrease in afterglow intensity.

Solution to Problem

One aspect of a scintillator for a charged particle beam apparatus according to the present invention for achieving the above object includes a substrate, a buffer layer provided on a surface of the substrate, a stacked body of a luminescent layer and a barrier layer, the stacked body being provided on a surface of the buffer layer, and a conductive layer provided on a surface of the stacked body. Then, the luminescent layer contains InGaN, the barrier layer contains GaN, and a ratio b/a of a thickness b of the barrier layer to a thickness a of the luminescent layer is from 11 to 25.

In addition, one aspect of a charged particle beam apparatus according to the present invention for achieving the above object is characterized by including an electron source that irradiates an analysis target object with an electron beam, and a secondary particle detector that detects secondary particles emitted when the analysis target object is irradiated with the electron beam, in which the secondary particle detector includes the above-described scintillator for a charged particle beam apparatus according to the present invention.

A more specific configuration of the present invention is described in the claims.

Advantageous Effects of Invention

According to the present invention, it is possible to provide a scintillator for a charged particle beam apparatus that achieves both an increase in luminescence intensity and a decrease in afterglow intensity.

Objects, configurations, and advantageous effects other than those described above will be clarified by the descriptions of the following embodiments.

DESCRIPTION OF EMBODIMENTS

Hereinafter, a charged particle beam apparatus provided with a detector using a scintillator as a detection element will be described. An example of an electron microscope, particularly, a scanning electron microscope (SEM) as the charged particle beam apparatus will be described below.

Figure 1:
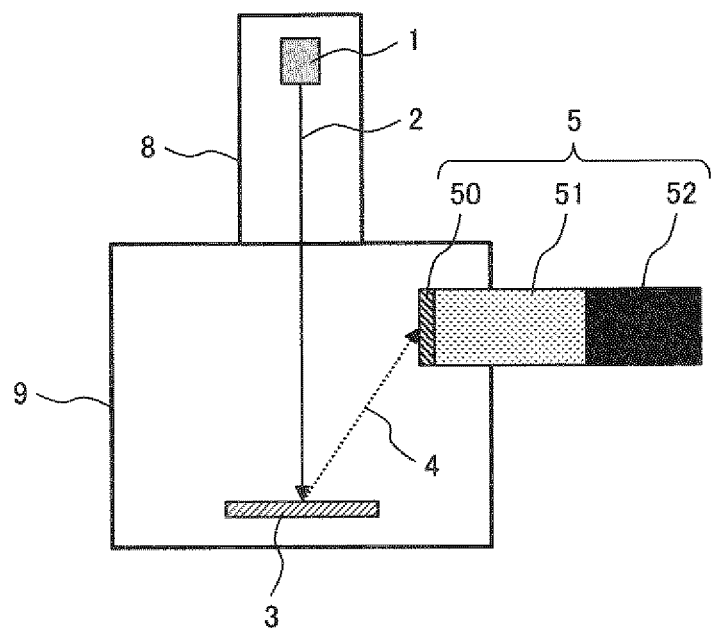
FIG. 1 is a schematic cross-sectional view illustrating a first example of a charged particle beam apparatus according to the present invention.

First, a configuration of a charged particle beam apparatus on which a detector is mounted will be described. FIG. 1 is a schematic cross-sectional view illustrating a first example of the charged particle beam apparatus according to the present invention. As illustrated in FIG. 1, a charged particle beam apparatus (electron microscope) 10a includes an analysis target object (sample) 3, an electron source 1 that irradiates the sample 3 with an electron beam (primary electron beam) 2, and a detector 5 that detects charged particles (secondary particles) 4 emitted from the sample 3 irradiated with the electron beam 2. The electron source 1 is accommodated in an electron optical lens barrel 8. The sample 3 is accommodated in a sample chamber 9.

The detector 5 includes a scintillator 50, a light guide 51, and a photodetector 52. Secondary particles 4 are drawn into the scintillator 50 of the detector 5 by applying a post voltage, and thus luminescence is caused in the scintillator 50. Light emitted from the scintillator 50 is guided by the light guide 51 and converted into an electric signal by the photodetector 52.

Figure 2:
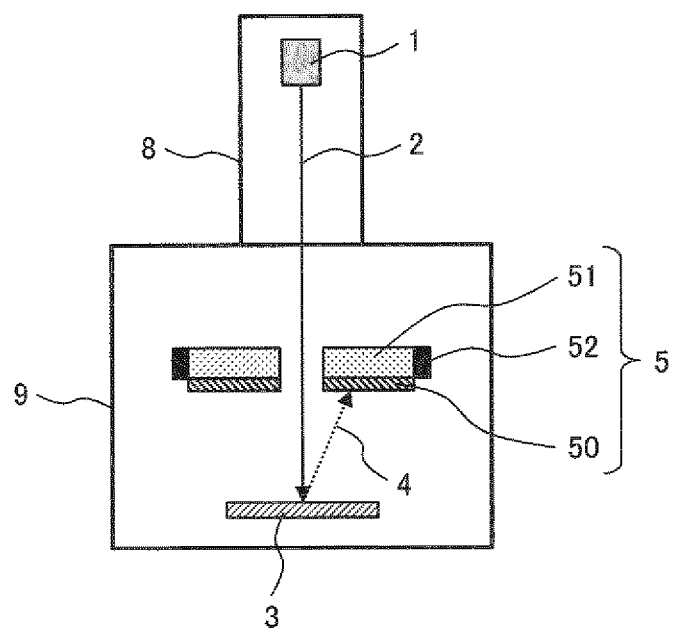
FIG. 2 is a schematic cross-sectional view illustrating a second example of the charged particle beam apparatus according to the present invention.

FIG. 2 is a schematic cross-sectional view illustrating a second example of the charged particle beam apparatus according to the present invention. In a charged particle beam apparatus (electron microscope) 10b illustrated in FIG. 2, by disposing the scintillator 50 of the secondary particle detector 5 immediately above the sample 3, the secondary particles 4 emitted from the sample 3 can be caused to be incident on the scintillator 50 without applying a post voltage. In addition, the scintillator 50 can detect the secondary particles 4 emitted in a wide angular range by expanding the surface on which the secondary particles 4 are incident. Therefore, even backscattered electrons having an amount smaller than that of the secondary electrons as the secondary particles 4 can be detected with high efficiency, and image observation and measurement with high accuracy can be performed.

In common with the charged particle beam apparatus 10a in FIG. 1 and the charged particle beam apparatus 10b in FIG. 2, the scintillator 50 and the light guide 51 can have various shapes as long as the scintillator 50 and the light guide 51 do not block the trajectory of the primary electron beam 2. For example, it is conceivable to have an annular shape centered on the primary electron beam 2. The scintillator 50 may have a shape covering the entire surface of the light guide 51 or a shape covering a portion of the light guide 51. In addition, the number of the photodetectors 52 may be one or plural, and may be placed at any position as long as luminescence of the scintillator 50 can be input. The photodetector 52 is disposed outside the sample chamber 9 in FIG. 1, but may be disposed in the sample chamber 9.

As the photodetector 52, a photomultiplier tube, a photodetector using a semiconductor, or the like can be used. In addition, the light guide 51 is used for inputting light from the scintillator 50 to the photodetector 52 in FIGS. 1 and 2, but light may be input by another method or another disposition.

A signal obtained by the photodetector 52 is converted into an image and displayed in association with an electron beam irradiation position. An electron optical system for focusing the primary electron beam 2 on the sample 3 and irradiating the sample 3 with the primary electron beam 2, that is, a deflector, a lens, an aperture, an objective lens, and the like are not illustrated. The electron optical system is installed in the electron optical lens barrel 8. The sample 3 is in a movable state by being placed on a sample stage (not illustrated). The sample 3 and the sample stage are disposed in the sample chamber 9. The sample chamber 9 is generally kept in a vacuum state. In addition, although not illustrated, the electron microscope is connected with a control unit that controls the whole operation and an operation of each component, a display unit that displays an image, an input unit that causes a user to input an operation instruction of the electron microscope, and the like.

The electron microscope is one example of the configuration. The charged particle beam apparatus in the present invention can be applied to other configurations as long as the charged particle beam apparatus is an electron microscope including the scintillator for a charged particle beam in the present invention, which will be described later. Further, the secondary particles 4 also include transmitted electrons, scanning transmitted electrons, and the like. In addition, although only one secondary particle detector 5 is illustrated in FIGS. 1 and 2 for simplicity, a detector for detecting backscattered electrons, a detector for detecting secondary electrons, and the like may be separately provided, or a plurality of detectors may be provided for detecting the azimuth angle or the elevation angle with distinguishing between the azimuth angle or the elevation angle.

Figure 3:
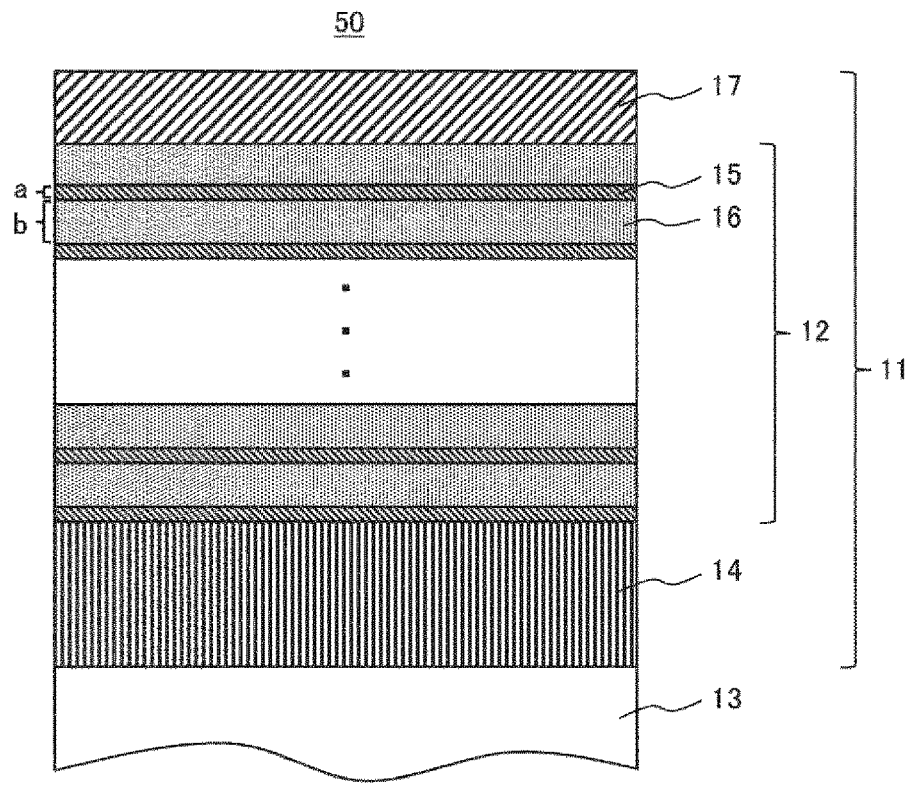
FIG. 3 is a schematic cross-sectional view illustrating an example of a scintillator for a charged particle beam apparatus according to the present invention.

Next, the scintillator 50 for a charged particle beam apparatus (also simply referred to as a "scintillator" below) in the present invention will be described. In the present specification, the scintillator refers to an element that causes a charged particle beam to be incident and thus causes light to be emitted. FIG. 3 is a schematic cross-sectional view illustrating an example of the scintillator for a charged particle beam apparatus according to the present invention.

As illustrated in FIG. 3, the scintillator 50 has a configuration in which a substrate 13, a buffer layer 14, a stacked body 12 of a luminescent layer 15 and a barrier layer 16, and a conductive layer 17 are stacked in this order. The buffer layer 14, the stacked body 12, and the conductive layer constitute a scintillator luminescence unit 11. The conductive layer 17 is formed on the side on which the charged particles as a detection target are incident in the charged particle beam apparatus.

As the material of the scintillator 50, for example, sapphire as the substrate 13, GaN as the buffer layer 14, InGaN as the luminescent layer 15, GaN as the barrier layer 16, and Al as the conductive layer 17 can be used. The buffer layer 14, the luminescent layer 15, and the barrier layer 16 can be formed by chemical vapor deposition (CVD). The stacked body 12 made of the above-described materials has a quantum well structure, and can obtain high luminescence intensity.

The substrate 13 has, for example, a disk shape of 2 to 4 inch φ. An object obtained by causing the buffer layer 14 and the stacked body 12 to grow, forming the conductive layer 17, and then cutting the resultant of the forming into a predetermined size can be used as the scintillator. The interface between the substrate 13 and the buffer layer 14 may have a flat structure or an uneven structure. For example, when a structure in which a protruding structure having a structure pitch of 10 to 10000 nm and a structure height of 10 to 10000 nm is continuously formed is used, the probability that light emission in the stacked body 12 can be extracted to the substrate 13 side increases, and the luminescence output can be improved.

The thickness of the buffer layer 14 is preferably equal to or more than 5 μm. The secondary particles 4 incident from the conductive layer 17 side do not reach the substrate 13 by setting the thickness of the buffer layer 14 to be equal to or more than 5 µm. Thus, luminescence due to the incidence of the charged particle beam on the substrate 13 can be suppressed.

By stacking the luminescent layer 15 and the barrier layer 16, carriers (electrons e⁻, holes h⁺) generated by the secondary particles 4 in the barrier layer 16 move inside the barrier layer 16. When the carriers reaches the luminescent layer 15 and recombination occurs, light is emitted. However, since the luminescent layer 15 and the barrier layer 16 have different compositions and different lattice constants, there is a possibility that distortion occurs in the structure due to a difference in lattice constant, and a decrease in luminescence intensity or an increase in yellow luminescence intensity being the main factor of afterglow occurs.

In general, since the barrier layer 16 is made thicker than the luminescent layer 15, the lattice constant of the stacked body 12 mainly depends on the barrier layer 16. However, when the luminescent layer 15 is stacked, the lattice constants of both the layers are deviated and distortion occurs, and this causes a decrease in crystallinity and an increase in afterglow.

As described above, since the stacked body 12 of the luminescent layer 15 and the barrier layer 16 has the quantum well structure, high luminescence intensity can be obtained. However, since the luminescent layer 15 and the barrier layer 16 having different lattice constants are stacked, distortion occurs, and thus crystallinity decreases, and afterglow increases. As a result of intensive studies, the present inventors have found that, by determining the thickness b of the barrier layer 16 in accordance with the thickness a of the luminescent layer 15, it is possible to suppress the occurrence of distortion, suppress a decrease in crystallinity, and reduce afterglow. The present invention is based on this finding.

Specifically, regarding the relation between the thickness a of the luminescent layer 15 and the thickness b of the barrier layer 16, b/a is preferably set to be from 11 to 25. If b/a is less than 11, the deviation of the lattice constant, which has occurred in the luminescent layer 15 cannot be suppressed in the barrier layer 16, and thus there is a possibility that distortion occurs and afterglow increases. In addition, if b/a is more than 25, there is a possibility that an arrival probability of carriers moving in the barrier layer 16 to the luminescent layer 15 decreases, and the luminescence intensity decreases. In addition, it is desirable that b/a be from 11 to 20, in order to highly exhibit the effects of further improving the luminescence intensity and decreasing the afterglow intensity.

The barrier layer 16 is preferably doped with Si. For example, Si is preferably doped so that the order of the concentration of Si in the barrier layer 16 is from $10^{16}$ to $10^{19}$ cm⁻³. If Si is doped, the mobility of carriers in the barrier layer 16 is improved, and the arrival probability to the luminescent layer 15 increases. Therefore, even when the barrier layer 16 is thickened, the recombination probability of carriers can be maintained, and the afterglow intensity can be reduced without reducing the luminescence intensity.

If the order of the concentration of Si to be doped is less than $10^{16}$ cm⁻³, the mobility of carriers becomes insufficient when the barrier layer 16 is thickened, and thus there is a possibility that the luminescence intensity decreases. In addition, if the order of the concentration of Si is more than $10^{19}$ cm⁻³, the change amount of the lattice constant of the barrier layer 16 due to Si doping increases, and thus there is a possibility that distortion occurs in the stacked body 12. Furthermore, in order to highly exhibit the effects of improving the luminescence intensity and decreasing the afterglow intensity, it is desirable that the concentration of Si in the barrier layer 16 have the order of $10^{17}$ to $10^{18}$ cm⁻³.

Also in the luminescent layer 15, Si may be doped in order to improve the mobility of carriers, but the order of the concentration of Si in the luminescent layer 15 is preferably equal to or less than $10^{16}$ cm⁻³. If the order of the concentration of Si is more than the order of $10^{16}$ cm⁻³, the difference in lattice constant between the luminescent layer 15 and the barrier layer 16 increases, and thus there is a possibility that distortion occurs in the stacked body 12, and the luminescence intensity decreases or the afterglow intensity increases.

The concentrations of Si in the luminescent layer 15 and the barrier layer 16 can be measured by secondary ion mass spectrometry (SIMS) or the like.

The thickness b of the barrier layer 16 is preferably set to be from 30 nm to 100 nm. If the thickness b is less than 30 nm, there is a possibility that distortion occurs in the stacked body 12, and thus a decrease in luminescence intensity and an increase in afterglow intensity are caused. In addition, if the thickness b is thicker than 100 nm, there is a possibility that an arrival probability of carriers moving in the barrier layer 16 to the luminescent layer 15 decreases, and the luminescence intensity decreases.

It is preferable that a plurality of luminescent layers 15 and a plurality of barrier layers 16 are alternately stacked. If the barrier layer 16 is thick, the number of generated carriers increases. However, if the barrier layer is too thick, there is a possibility that the arrival probability of carriers to the luminescent layer 15 decreases, and the luminescence intensity decreases. At this time, by alternately stacking a plurality of the luminescent layers 15 and a plurality of the barrier layers 16, the total thickness of the barrier layers 16 included in the stacked body 12 can be increased while maintaining the thickness of each barrier layer 16. Thus, it is possible to achieve both an increase in the number of carriers and an improvement in the arrival probability of carriers to the luminescent layer 15.

The thickness of the stacked body 12 is preferably from 200 nm to 1000 nm. If the thickness of the stacked body 12 is less than 200 nm, the number of carriers generated in the barrier layer 16 is small. Thus, the luminescence intensity decreases. In addition, if the stacked body 12 is thicker than 1000 nm, there is a possibility that, even though light is emitted, the light is absorbed in the stacked body 12 before reaching the buffer layer 14 side, and the light extraction amount from the scintillator decreases.

The number of the luminescent layers 15 and the number of the barrier layers 16 are preferably set to be from 5 to 25, respectively. If the number of layers is less than 5, there is a possibility that the stacked body 12 cannot be thickened, and the luminescence intensity is lowered. In addition, if the number of layers is more than 25, there is a possibility that distortion occurs by stacking a large number of layers having different lattice constants, and thus a decrease in luminescence intensity and an increase in afterglow intensity are caused. Furthermore, since the stacked body 12 becomes thick, there is a possibility that light is absorbed in the stacked body 12 and the light extraction amount decreases.

The thickness of the conductive layer 17 is preferably set to be from 40 nm to 200 nm. If the conductive layer 17 is thinner than 40 nm, there is a possibility of charging when the secondary particles 4 are incident. In addition, if the conductive layer 17 is thicker than 200 nm, there is a possibility that energy is lost when the secondary particles 4 pass through the conductive layer 17, and the incident amount of the charged particle beam on the stacked body 12 decreases. As the material of the conductive layer 17, other materials, alloys, and the like can be used in addition to Al as long as the material is a conductive material.

The layer thicknesses of the buffer layer 14, the luminescent layer 15, the barrier layer 16, and the conductive layer 17, the number of the buffer layers 14, the number of the luminescent layers 15, the number of the barrier layers 16, and the number of the conductive layers 17 can be measured by using a transmission electron microscope (TEM), an X-ray, or the like.

In the case of an LED (light emitting diode), carriers are recombined at a pn junction portion between a p-type semiconductor and an n-type semiconductor by current injection, and thus light is emitted. On the other hand, in the scintillator illustrated in FIG. 3, excitation of carriers by charged particles incident in the n-type structure and light emission due to the recombination are caused. Therefore, light can be emitted without the pn junction.

In the scintillator described above, light can be propagated not only in an up-down direction in the scintillator (direction from the conductive layer 17 toward the substrate 13) but also in a left-right direction. Therefore, regarding the scintillator 50 having a large incident surface of the secondary particles 4 from the sample 3 as illustrated in FIG. 2, even when the light guide 51 guides light to the photodetector 52 having a surface provided at an angle of 90 degrees with the incident surface, the detection efficiency of light in the photodetector 52 can be improved by light propagating inside the scintillator 50.

Figure 4:
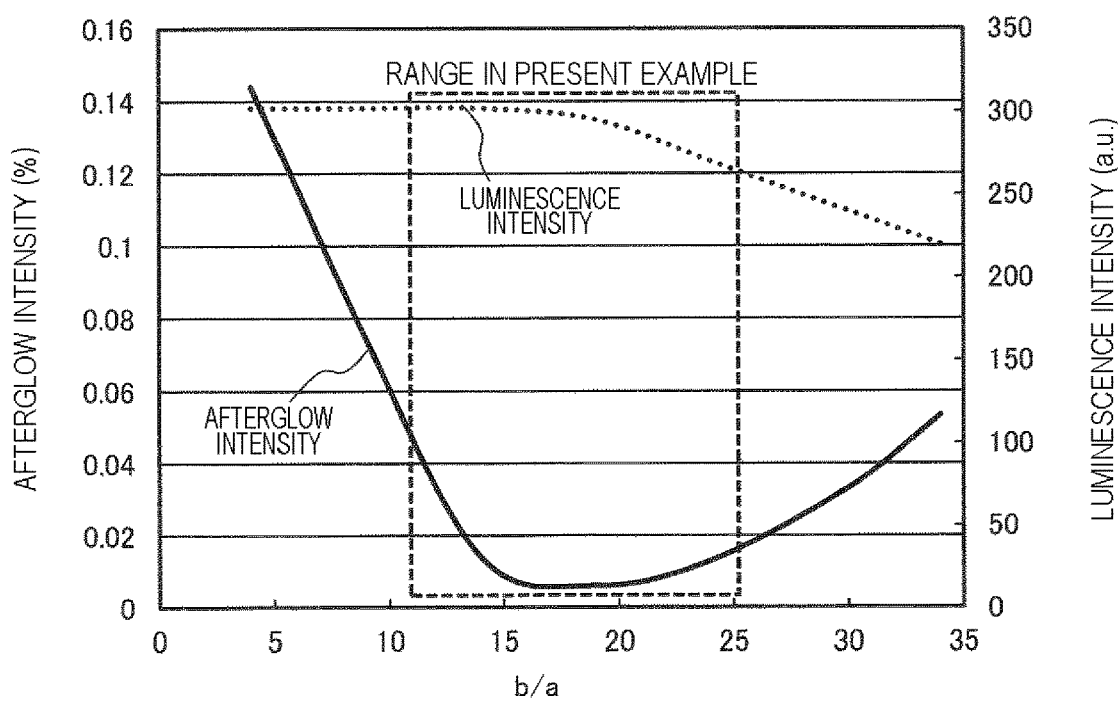
FIG. 4 is a graph showing a relation between a ratio b/a of a thickness b of a barrier layer 16 to a thickness a of a luminescent layer 15, luminescence intensity, and afterglow intensity.

FIG. 4 is a graph showing the relation between the ratio b/a of the thickness b of the barrier layer 16 to the thickness a of the luminescent layer 15, the luminescence intensity, and the afterglow intensity. In FIG. 4, a scintillator having peak luminescence intensity in the vicinity of 415 nm is used, and a value obtained by integrating the intensity at 380 to 480 nm is shown as the luminescence intensity. The afterglow intensity was shown by the ratio of the intensity of yellow luminescence at 550 nm to the peak luminescence intensity at the vicinity of 415 nm.

As illustrated in FIG. 4, it was understood that the afterglow intensity was sufficiently reduced (0.06% or less) in a section in which b/a is 11 to 25. In addition, it is understood that the luminescence intensity can be maintained at the same level at this time. That is, it is understood that, by setting b/a to 11 to 25, the decrease in the luminescence intensity can be suppressed and the afterglow intensity can be decreased.

Figure 5:
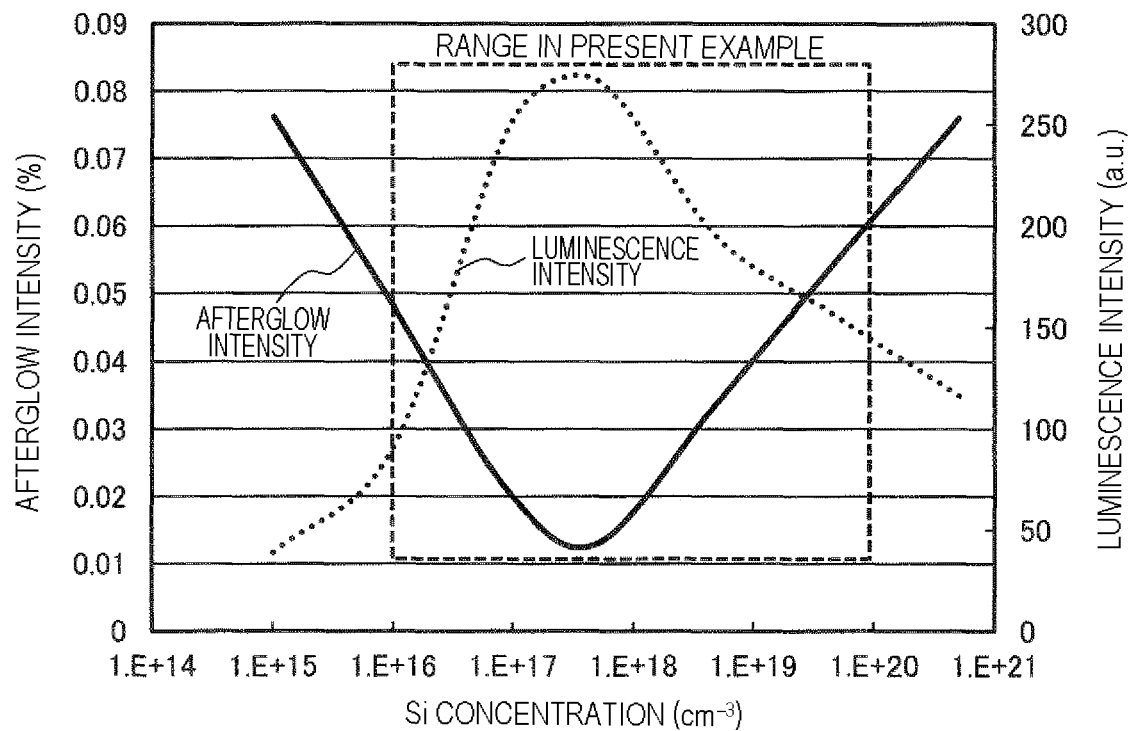
FIG. 5 is a graph showing a relation between Si concentration of the barrier layer 16, the luminescence intensity, and the afterglow intensity.

FIG. 5 is a graph showing the relation between the Si concentration of the barrier layer 16, the luminescence intensity, and the afterglow intensity. The results of evaluating the luminescence intensity and the afterglow intensity by the same method as in FIG. 4 are shown. From this graph, it is understood that, if the order of the Si concentration is set to be $10^{16}$ to $10^{19}$ cm$^{-3}$, the afterglow intensity decreases to be equal to or less than 0.06% of the luminescence intensity. That is, it is understood that the afterglow intensity can be decreased by setting the Si concentration to the order of $10^{16}$ to $10^{19}$ cm$^{-3}$.

In the above measurement, the scintillator having a peak luminescent wavelength in the vicinity of 415 nm was used, but it was understood that, when the peak luminescent wavelength was increased up to the vicinity of 450 nm by changing the In concentration or the like of the luminescent layer 15, the same result was obtained.

In the above description, an example in which the scintillator is applied to a detector such as a scanning electron microscope has been mainly described, but the scintillator for a charged particle beam apparatus in the present invention may be adopted as a detector of a mass spectrometer.

Figure 6:
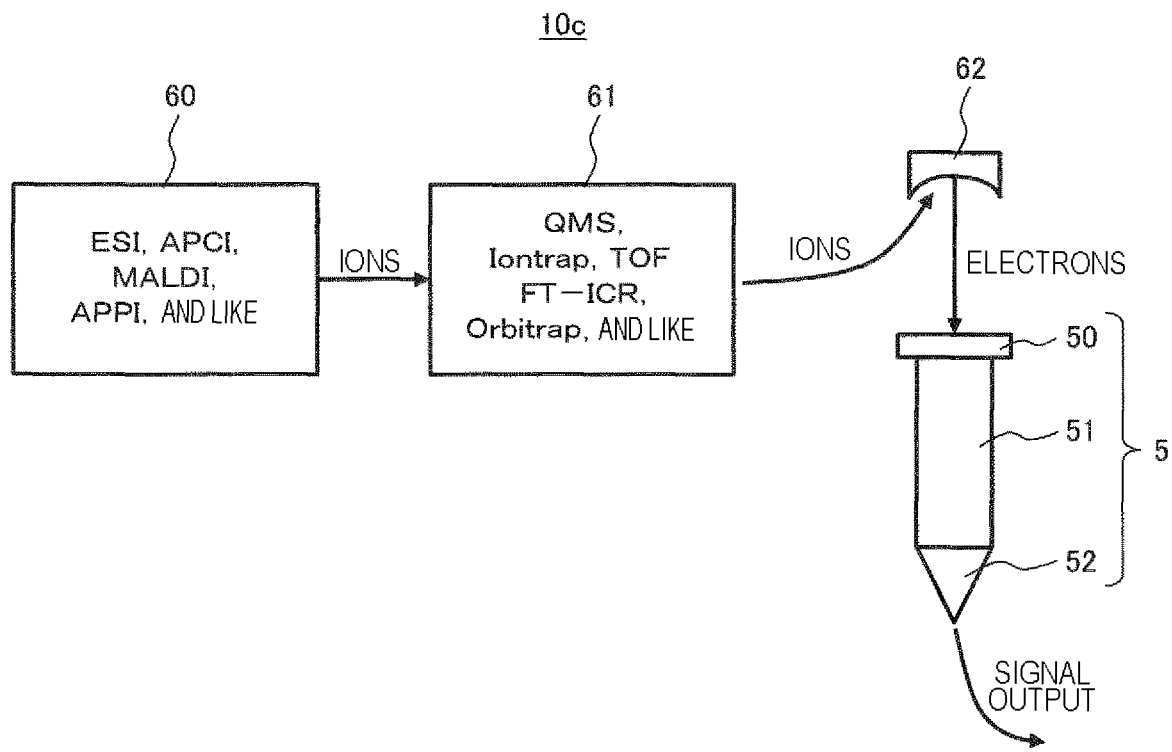
FIG. 6 is a schematic cross-sectional view illustrating a third example of the charged particle beam apparatus according to the present invention.

The mass spectrometer performs mass separation of ions by an electromagnetic action, and measures a mass/charge ratio of ions to be measured. FIG. 6 is a schematic cross-sectional view illustrating a third example of the charged particle beam apparatus according to the present invention. FIG. 6 illustrates a configuration of a mass spectrometer as a charged particle beam apparatus 10c. A mass spectrometer 10c illustrated in FIG. 6 includes an ionization unit 60 that ionizes a sample as an analysis target, a mass separation unit 61 that mass-selects ions extracted by the ionization unit 60, a conversion dynode (conversion electrode) 62 that converts ions mass-selected by the mass separation unit 61 into charged particles by colliding the ions with an electrode, and a secondary particle detector 5 that detects the charged particles generated by the conversion dynode 62.

As a method of ionization of the ionization unit 60, there are ESI (Electrospray Ionization), APCI (Atmospheric Pressure Chemical Ionization), MALDI (Matrix-Assisted Laser Desorption Ionization), APPI (Atmospheric Pressure Photo-Ionization), and the like. In addition, as the mass separation unit 61, there are a QMS (Quadrupole Mass Spectrometer) type, an Iontrap type, a time-of-flight type, an FT-ICR (Fourier Transform Ion Cyclotron Resonance) type, an Orbitrap type, and a combination type thereof.

The secondary particle detector 5 has the same configuration as the secondary particle detector 5 illustrated in FIGS. 1 and 2, and includes the scintillator 50 for a charged particle beam apparatus in the present invention. By applying the scintillator 50 for a charged particle beam apparatus in the present invention, it is possible to provide the mass spectrometer 10c capable of performing high-speed and high-sensitivity analysis.

As described above, according to the present invention, it has been shown that it is possible to provide a scintillator for a charged particle beam apparatus that achieves both an increase in luminescence intensity and a decrease in afterglow intensity.

Note that, the present invention is not limited to the above example, and various modifications may be provided. For example, the above examples are described in detail in order to explain the present invention in an easy-to-understand manner, and the above embodiments are not necessarily limited to a case including all the described configurations. Further, some components in one embodiment can be replaced with the components in another embodiment, and the configuration of another embodiment can be added to the configuration of one embodiment. Regarding some components in the embodiments, other components can be added, deleted, and replaced.

In the above-described embodiment of the present invention, the SEM and the mass spectrometer have been described as examples of the charged particle beam apparatus in the present invention, but the charged particle beam apparatus in the present invention is not limited thereto. Application to other devices using an ion beam is also possible.

In addition, the present invention can be applied not only to observation but also to a semiconductor pattern measuring apparatus, an inspection apparatus, and the like as an application in a case using SEM.

REFERENCE SIGNS LIST 10a, 10b charged particle beam apparatus (electron microscope device)
10c charged particle beam apparatus (mass spectrometer)
1 electron source
2 primary electron beam
3 analysis target object (sample)
4 secondary particle
5 secondary particle detector
50 scintillator
51 light guide
52 photodetector
8 electron optical lens barrel
9 sample chamber
11 scintillator luminescence unit
12 stacked body of luminescent layer and barrier layer
13 substrate
14 buffer layer
15 luminescent layer
16 barrier layer
17 conductive layer
60 ionization unit
61 mass separation unit
62 conversion electrode.

The invention claimed is:

1. A scintillator for a charged particle beam apparatus, the scintillator comprising:
a substrate;
a buffer layer provided on a surface of the substrate;
a stacked body of a luminescent layer and a barrier layer, the stacked body being provided on a surface of the buffer layer; and
a conductive layer provided on a surface of the stacked body,
wherein the luminescent layer contains InGaN,
the barrier layer contains GaN, and
a ratio b/a of a thickness b of the barrier layer to a thickness a of the luminescent layer is from 11 to 25.

2. The scintillator for a charged particle beam apparatus according to claim 1, wherein b/a is from 11 to 20.

3. The scintillator for a charged particle beam apparatus according to claim 1, wherein
the barrier layer contains Si, and
an order of concentration of Si is from $10^{16}$ cm$^{-3}$ to $10^{19}$ cm$^{-3}$.

4. The scintillator for a charged particle beam apparatus according to claim 1, wherein
the barrier layer contains Si, and
an order of concentration of Si is from $10^{17}$ cm$^{-3}$ to $10^{18}$ cm$^{-3}$.

5. The scintillator for a charged particle beam apparatus according to claim 1, wherein the thickness b of the barrier layer is from 30 nm to 100 nm.

6. The scintillator for a charged particle beam apparatus according to claim 1, wherein
the luminescent layer contains Si, and
an order of concentration of Si is less than $10^{16}$ cm$^{-3}$.

7. The scintillator for a charged particle beam apparatus according to claim 1, further comprising a stacked body in which the luminescent layer and the barrier layer are alternately stacked.

8. The scintillator for a charged particle beam apparatus according to claim 7, wherein a thickness of the stacked body is from 200 nm to 1000 nm.

9. The scintillator for a charged particle beam apparatus according to claim 8, wherein the number of the luminescent layers and the number of the barrier layers are from 5 to 25, respectively.

10. The scintillator for a charged particle beam apparatus according to claim 1, wherein the conductive layer is Al.

11. The scintillator for a charged particle beam apparatus according to claim 1, wherein the buffer layer contains GaN.

12. The scintillator for a charged particle beam apparatus according to claim 1, wherein a thickness of the buffer layer is equal to or more than 5 μm.

13. A charged particle beam apparatus comprising:
an electron source that irradiates an analysis target object with an electron beam; and
a secondary particle detector that detects secondary particles emitted when the analysis target object is irradiated with the electron beam,
wherein the secondary particle detector includes the scintillator for a charged particle beam apparatus described in claim 1.

14. The charged particle beam apparatus according to claim 13, wherein the scintillator for a charged particle beam apparatus is provided immediately above the analysis target object from which the secondary particles are emitted.

15. The charged particle beam apparatus according to claim 13, wherein the charged particle beam apparatus is an electron microscope device or a mass spectrometer.

* * * * *